US006255897B1

(12) United States Patent
Klemmer

(10) Patent No.: US 6,255,897 B1
(45) Date of Patent: Jul. 3, 2001

(54) CURRENT BIASING CIRCUIT

(75) Inventor: Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/162,176

(22) Filed: Sep. 28, 1998

(51) Int. Cl.$^{7}$ .................................................. H03F 3/343

(52) U.S. Cl. .......................... 327/538; 327/543; 323/315

(58) Field of Search .................................. 327/538, 541, 327/543; 323/315, 316; 330/288

(56) References Cited

U.S. PATENT DOCUMENTS

| | | | | |
|---|---|---|---|---|
| 4,251,778 | * | 2/1981 | Ahmed | 330/288 |
| 4,311,967 | * | 1/1982 | Schade, Jr. | 330/288 |
| 4,334,198 | * | 6/1982 | Malchow | 330/288 |
| 4,686,487 | * | 8/1987 | Radovsky | 330/288 |
| 4,769,619 | * | 9/1988 | Taylor | 330/288 |
| 5,166,553 | | 11/1992 | Kotera et al. | 326/115 |
| 5,446,368 | | 8/1995 | Uscategui | 323/315 |
| 5,874,852 | * | 2/1999 | Brambilla et al. | 327/538 |

OTHER PUBLICATIONS

Toumazou, C. et al.: "High Frequency Gallium Arsenide Current Mirror", *Electronics Letters*, vol. 26, No. 21, Oct. 11, 1990, pp. 1802–1804.

Pflueger, R. J.: "New RTD–Bootstrapped Current and Voltage. References II. Mirror–based References", IEEE Transactions on Circuits and Systems I: Fundamental Theory and Applications, vol. 41, No. 11, Nov. 1, 1994, pp. 744–747.

* cited by examiner

*Primary Examiner*—Tuan T. Lam

(74) *Attorney, Agent, or Firm*—Wood, Phillips, VanSanten, Clark & Mortimer

(57) ABSTRACT

A current mirror circuit is disclosed including a reference device and a biased device, each having control, input and output elements, with the control element of the biased device operably connected to the control element of the reference device. A reference current source is connected to the input element of the reference device and produces a reference current flowing through the reference device, wherein a bias current is produced in the biased device as a multiple of the reference current. A compensation network is connected between the biased device and the reference device for maintaining a constant bias current in the biased device regardless of varying operating characteristics in at least one of the biased device and the reference device.

29 Claims, 6 Drawing Sheets

CURRENT BIASING CIRCUIT

FIELD OF THE INVENTION

The present invention is directed toward a current biasing circuit and, more particularly, a current biasing circuit compensating for changes in device parameters.

BACKGROUND OF THE INVENTION

Current biasing circuits, or "current mirror" circuits, are generally well known. Current mirrors generally use transistors, FETs (Field-Effect Transistors) or BJTs (Bipolar Junction Transistors), to produce a controlled current in a "biased" device as a multiple of a reference current that flows in a "reference" device. In an ideal case, the multiplying factor depends only upon the geometrical properties of the reference and the biased device.

Current mirrors constructed of conventional transistor devices should come close to the ideal case, where the physical geometry of the transistors is the sole factor influencing errors. Transistors typically used in current mirror devices include MOSFET (Metal Oxide Semiconductor Field-Effect Transistor), MESFET (Metal Semiconductor Field-Effect Transistor), HEMT (High-Electron-Mobility Transistor) and PHEMT (Pseudomorphic High-Electron-Mobility Transistor) devices. The operation of these transistors is based upon the strength of an electrical field in a "channel" underneath a "gate" region. In the ideal case, inaccuracies in the current multiplication factor should relate back only to lithographic errors, which are unavoidable in semiconductor device manufacturing. However, the lithographic errors can be minimized.

If the electrical device transfer functions are ideal, in the sense that differences in the electrical environment or temperature of the reference device and the biased device do not influence the current multiplication factor, then the geometrical errors of the devices define the accuracy limit that can be achieved. However, this is not generally the case, particularly in advanced transistor devices with very short channel lengths; the channel length being the physical length of the gate contact. Various operational parameters influence the current multiplication factor in traditional current mirror devices.

For instance, short channel effects, which result from channel length modulation due to changes in the transistor's drain-source voltage, effect the current multiplication ratio. Velocity saturation effects, which depend on the transistor's drain-source voltage and result from the limited drift velocity of charge carriers in the channel region of the transistor substrate, also effect the current multiplication ratio. Threshold voltage modulation effects also influence the current multiplication ratio. The threshold voltage modulation effects generally result from either a barrier lowering effect caused by increasing drain-source voltage in short channel length transistors, or a barrier increasing effect, particular to short channel length silicon MOSFET transistors, caused by increasing source-bulk voltage. Still further, drain-gate reverse leakage current, common to FETs, has an effect on the current multiplication ratio. The drain-gate leakage current typically results from reverse leakage, including tunnelling, in the gate-source Schottky contact in MESFET devices, or tunnelling through the gate oxide region in MOSFET devices.

The present invention is directed toward overcoming one or more of the above-mentioned problems.

SUMMARY OF THE INVENTION

A current mirror circuit is disclosed including a reference device and a biased device, each having control, input and output elements, with the control element of the biased device operably connected to the control element of the reference device. A reference current source is connected to the input element of the reference device and produces a reference current flowing through the reference device, wherein a bias current is produced in the biased device as a multiple of the reference current. A compensation network is connected between the biased device and the reference device for maintaining a constant bias current in the biased device regardless of varying operating characteristics in at least one of the biased device and the reference device.

In one form, the reference and biased devices include field effect transistors having gate, drain and source elements corresponding to the control, input and output elements.

In another form, the reference and biased currents flow from the drain to source elements in the reference and biased transistors, respectively. The varying operating characteristics include a varying voltage across the drain and source elements of at least one of the biased transistor and the reference transistor.

The varying voltage across the drain and source elements of at least one of the biased transistor and the reference transistor results from at least one of threshold voltage modulation, short channel effects and gate leakage current occurring in at least one of the biased transistor and the reference transistor.

In another form, the compensation network includes a first resistor connected between the input element of the reference device and the control element of the biased device, and a second resistor connected between the input element of the biased device and the control element of the reference device.

The current mirror circuit may further include third and fourth resistors serially connected between the control elements of the reference device and the biased device. A feedback loop is provided between a node common to the third and fourth resistors and the input element of the reference device. Depending upon the types of transistors implemented in the current mirror circuit, the feedback loop may include a unity gain amplifier or a level shifter biasing the reference device to operate in a saturation mode. The first and second resistors may have equal resistance values, and the third and fourth resistors may have equal resistance values.

In another form, the compensation network further includes a compensation device having control, input and output elements, with the input element of the compensation device connected to the input element of the biased device, and the control element of the compensation device connected to the control element of the reference device. A fifth resistor is connected between the output element of the compensation device and ground.

The compensation device may include a field effect transistor having gate, drain and source elements corresponding to the control, input and output elements.

In another form, the compensation network further includes a sixth resistor connecting the second and third resistors to the control element of the reference device, and a seventh resistor connecting the first and fourth resistors to the control element of the biased device.

An object of the present invention is to cancel the effects of threshold voltage modulation in a current mirror device.

A further object of the present invention is to cancel the influence of short channel effects in a current mirror device.

A further object of the present invention is to cancel the influence of gate leakage current related effects in a current mirror device.

A further object of the present invention is to maintain a constant output current in a current mirror device regardless of voltage changes in either the reference or biased device.

Other aspects, objects and advantages of the present invention can be obtained from a study of the application, the drawings, and the appended claims.

DETAILED DESCRIPTION OF THE PREFERRED EMBODIMENT

A common solution to the problem of providing a controlled current in a biased device is to "mirror" a reference current (typically much smaller than the current in the biased device for DC current efficiency reasons) that flows in a reference device into the biased device. Typically, such circuits are known as "current mirrors". Current mirrors generally utilize FET devices operating in the saturation region. The DC transfer characteristics of an FET device operation in the saturation region are described in the following equation:

$$I_D=(K/2)(W/L)[V_{GS}-(V_{to}-\alpha V_{DS})]^n(1+\lambda V_{DS}), \quad \text{(Eq. 1)}$$

where $I_D$=drain current,

K=constant (depends on specific process parameters, e.g., layer thickness, carrier mobility, doping levels, etc.), w=channel width, L=channel length, $V_{GS}$=gate-source voltage, $V_{to}$=threshold voltage without threshold voltage modulation ($V_{to}>0$ for enhancement mode transistors; $V_{to}<0$ for depletion mode transistors), $V_{DS}$=drain-source voltage, $\alpha$=threshold voltage modulation coefficient, n=velocity saturation index (n=2 in a long channel device without velocity saturation; n=1 in an extreme short channel device with velocity saturation); in a typical 0.5 $\mu$m hannel length device n≈1.5, and $\lambda$=channel length modulation coefficient (or "Early-Voltage" coefficient).

Figure 1:
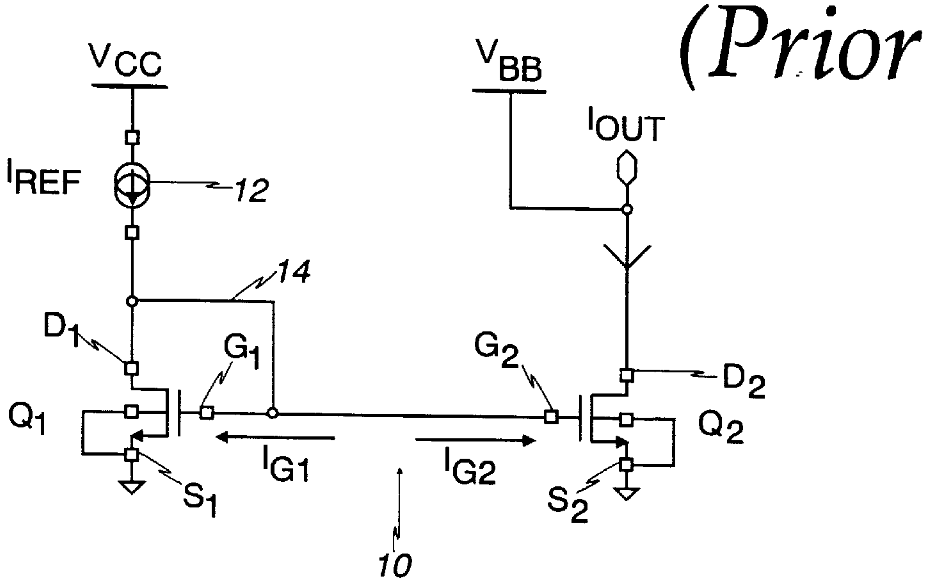
Fig. 1 (Prior Art)
FIG. 1 shows a prior art current mirror circuit in silicon MOSFET technology using enhancement mode n-channel transistors.

FIG. 1 illustrates a typical prior art current mirror, shown generally at 10, in silicon MOSFET technology using enhancement mode n-channel transistors $Q_1$ and $Q_2$ operating in the saturation region, each transistor $Q_1$,$Q_2$ having drain D, source S and gate G contacts. In operation, the gate currents $I_{G1}$ and $I_{G2}$ flowing into the gates $G_1$ and $G_2$ of transistors $Q_1$ and $Q_2$ are zero (or very small compared to the reference current $I_{REF}$ supplied by current source 12). The drain-source voltage $V_{DSI}$ of transistor $Q_1$ is equal to its gate-source voltage $V_{GSI}$ due to the feedback loop 14. The feedback loop 14 adjusts the gate-source voltage $V_{GS1}$ of transistor $Q_1$ such that the entire reference current $I_{REF}$ will flow as the drain current of the "reference device" $Q_1$.

Since the gates $G_1$,$G_2$ of the two transistors $Q_1$,$Q_2$ are connected together with their sources $S_1$,$S_2$ connected to ground, and since there is no gate current flowing that would establish any voltage drop ($I_{GI}=I_{G2}=0$), the gate voltages applied to transistors $Q_1$ and $Q_2$ will be equal ($V_{GS1}=V_{GS2}$). Thus, the output current $I_{OUT}$ will mirror the reference current $I_{REF}$. The accuracy of the current mirror 10 is limited by the threshold voltage mismatch of the two transistors $Q_1$ and $Q_2$, as well as by short channel effects.

In order to achieve current multiplication ratios other than unity, the channel widths $W_1$,$W_2$ of the transistors $Q_1$,$Q_2$ must be different. In an ideal case, the channel width $W_2$ of $Q_2$ is an integer multiple of the channel width $W_1$ of $Q_1$. This will equalize the influence of short channel effects on the current multiplication ratio. In this case, $I_{OUT}$ is related to the channel widths $W_1$,$W_2$ as follows:

$$I_{OUT}=I_{REF}(W_2/W_1). \quad \text{(Eq. 2)}$$

Figure 2:
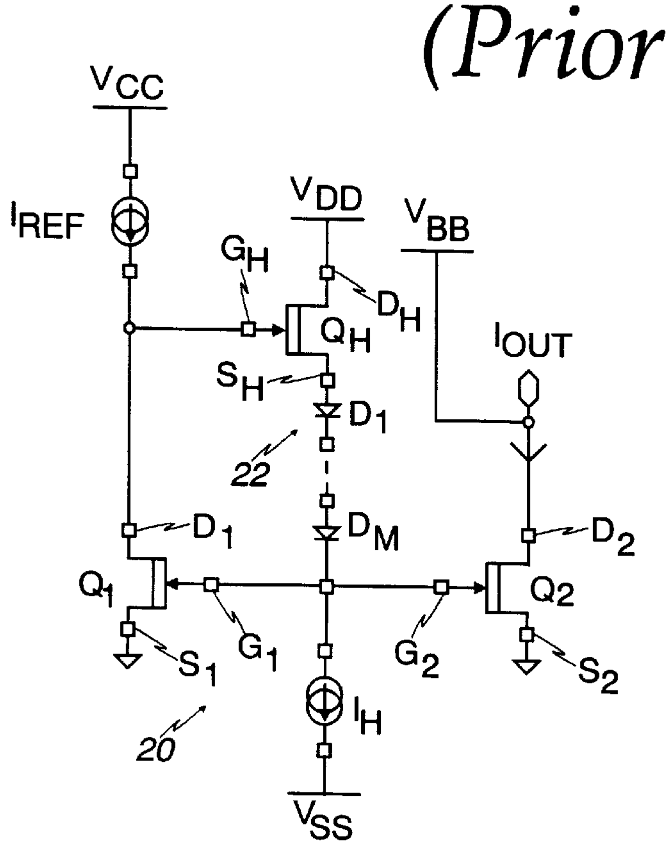
Fig. 2 (Prior Art)
FIG. 2 shows a prior art current mirror circuit in GaAs MESFET technology using depletion mode n-channel transistors.

FIG. 2 illustrates a conventional current mirror, shown generally at 20, in GaAs MESFET technology using depletion mode n-channel transistors $Q_1$ and $Q_2$. The operation of the depletion mode current mirror 20 is identical to the operation of the enhancement mode current mirror 10 shown in FIG. 1, with the exception that measures have to be taken to account for the negative threshold voltage ($V_t<0$) of transistors $Q_1$,$Q_2$ in the depletion mode current mirror 20.

In order to ensure transistor operation in the saturation region, an additional level shift is necessary between the gate $G_1$ and drain $D_1$ of the reference transistor $Q_1$. This additional level shift is accomplished by a level shifter circuit 22 connected between the gate $G_1$ and drain $D_1$ of transistor $Q_1$ The level shifter 22 generally includes a series of diodes $D_1$ . . . $D_M$ that are forward biased by a "helper current" $I_H$ and voltage source $V_{ss}$ ($V_{ss}$may be any negative voltage), and connected between the drain $D_1$ and gate $G_1$ of $Q_1$ through a "helper source follower" transistor $Q_H$. The voltage gain of the level shifter 22 is unity and its effect on the current mirror 20 is similar to that of the feedback loop 14 as described with respect to FIG. 1.

Figure 3:
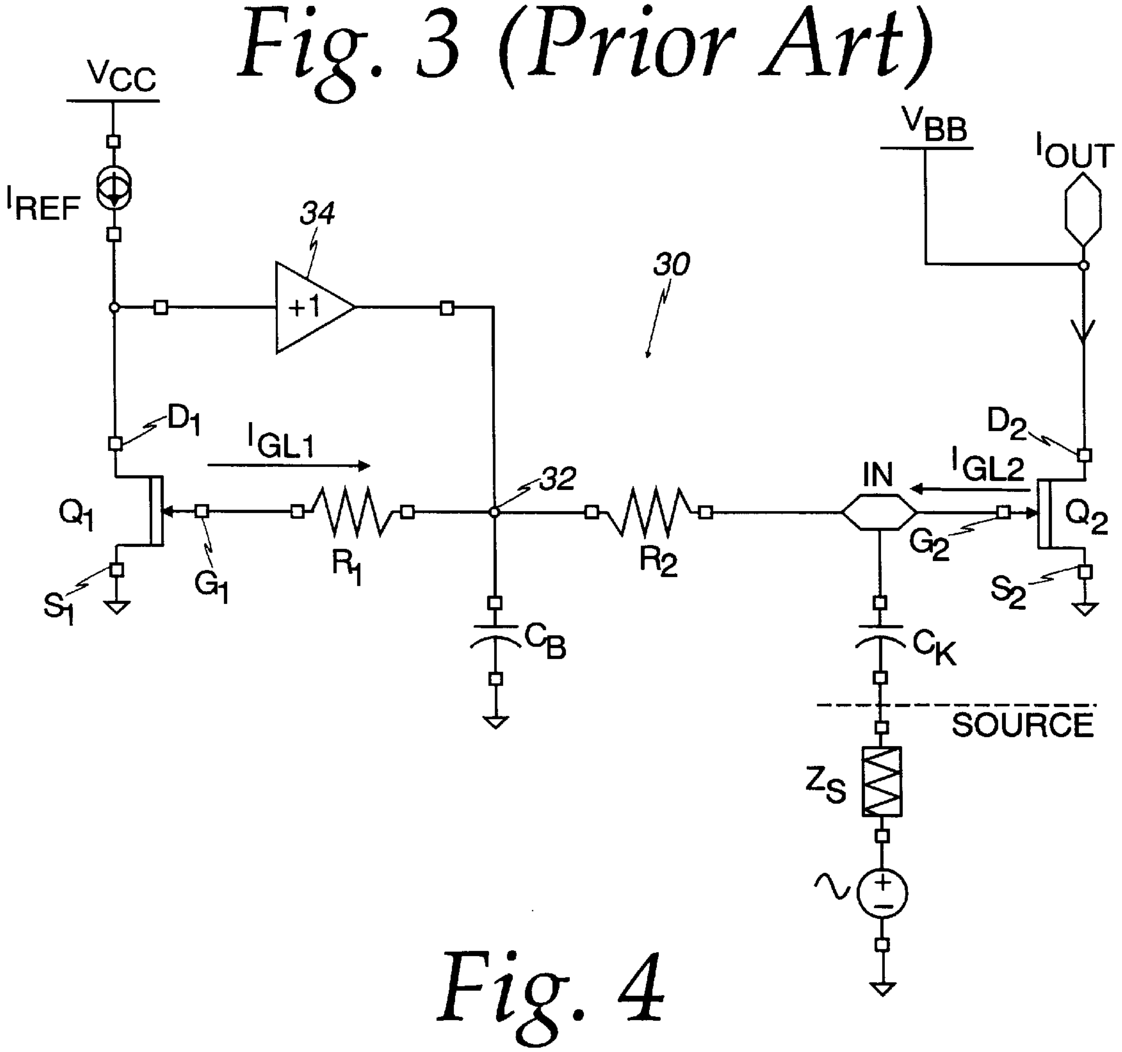
Fig. 3 (Prior Art)
FIG. 3 shows a prior art biasing circuit utilized in common source amplifiers.

FIG. 3 illustrates a conventional biasing circuit, shown generally at 30, utilized in common source amplifiers. A solution to the problem of biasing common source amplifiers is an extension of the current mirrors 10,20 shown in FIGS. 1 and 2 by the addition of two resistors $R_1$ and $R_2$ serially connected between the gates $G_1$ and $G_2$ of transistors $Q_1$ and $Q_2$, and a bypass capacitor $C_B$ connected between a node 32 common to resistors $R_1$ and $R_2$ and ground. In the biasing circuit 30 shown in FIG. 3, depending upon the implementation with either enhancement mode (FIG. 1) or depletion mode (FIG. 2) transistors, the unity gain amplifier 34 may be replaced with either the level shifter 22 (with current source $I_H$ and voltage source $V_{SS}$) of FIG. 2 or the feedback loop 14 of FIG. 1.

The bypass capacitor $C_B$ accomplishes a low impedance at the center node 32 such that the resistor $R_2$, together with the gate input impedance of transistor $Q_2$, determine the overall input impedance seen by the signal SOURCE connected to the gate $G_2$ of transistor $Q_2$ through capacitor $C_K$. Resistor $R_1$ should have a resistance equal to $R_2 \times (W_2/W_1)$ to aid in reducing the effects of gate leakage current. In the case of a linear amplifier, such as a low noise amplifier or a linear power amplifier, the reference current $I_{REF}$ should be chosen such that the gain of the biasing circuit 30 is independent of device tolerances. In the case of a saturated amplifier, the reference current $I_{REF}$ should be chosen to be constant over temperature variations. Thus, assuming a unity gain amplifier 34, $I_{REF}=I_{OUT}$.

One disadvantage in the circuits previously described, is that in the presence of short channel effects, the current multiplication ratio will be different from the geometrical value $(W_2/W_1)$ in the case where the drain-source voltages $V_{DS1}$ and $V_{DS2}$ on the reference device $Q_1$ and the biased device $Q_2$ are different. Generally, it can be found that in MOSFET and MESFET devices, the channel length modulation coefficient $\lambda$ increases as the channel length of the device decreases. In a common source amplifier case (FIG. 3) the minimum channel length available in the transistor technology in which the circuit is implemented is the most desirable one to use since it allows for the highest frequency of operation of the circuit. Thus, in order to achieve a desired drain current $I_{D2}$ ($I_{OuT}$) operating point for the biased device $Q_2$ over drain-source voltage $V_{DS2}$ variations, caused by, for example, supply voltage ($V_{BB}$) variations, the influence of $\lambda$ must be compensated for.

Another disadvantage in the previously described circuits is that in the presence of threshold voltage modulation in short channel devices, the drain current $I_{D2}$ ($I_{OUT}$) in the biased device $Q_2$ will again be affected by changes in the drain-source voltage $V_{DS2}$.

Figure 4:
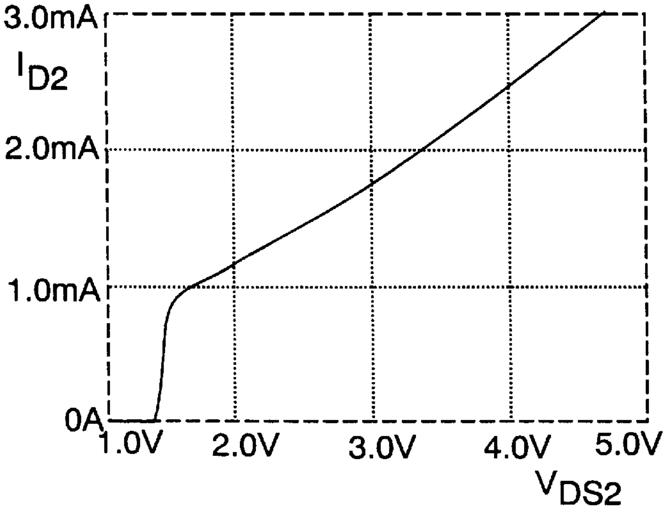
FIG. 4 is a graph illustrating the relationship between drain current and drain-source voltage in a biased transistor of a current mirror circuit due to short channel and threshold voltage modulation effects.

FIG. 4 illustrates the drain current $I_{D2}$ ($I_{OUT}$) in the biased device $Q_2$ as a function of its drain-source voltage $V_{DS2}$ due to short channel and threshold voltage modulation effects. The transistors $Q_1$ and $Q_2$ utilized to generate the graph of FIG. 4 are PHEMT transistors having a channel length of 0.5 Am. The geometric channel width ratio $(W_2/W_1)$ is unity, the reference current $I_{REF}$ is 1 mA, and therefore the desired output current $I_{D2}$ ($I_{OUT}$) is 1 mA. However, as shown in FIG. 4, the output current $I_{D2}$ ($I_{OUT}$) increases as $V_{DS2}$ increases. The deviation shown in FIG. 4 is entirely due to short channel and threshold voltage modulation effects.

Another disadvantage to the general solution, as shown in FIG. 3, for biasing common source amplifiers is that any gate leakage current $I_{GL1}$, $I_{GL2}$ out of the gates $G_1$,$G_2$ of transistors $Q_1$ and/or $Q_2$ will cause voltage drops across the serially connected resistors $R_1$ and $R_2$. Even if the two resistors $R_1$,$R_2$ are ratioed according to the geometrical channel width ratio such that $W_2/W_1=R_2/R_1$, the voltage drops across the resistors $R_1$ and $R_2$ will be different since the drain-source voltages $V_{DS1}$ and $V_{DS2}$ (and also the drain-gate voltages $V_{DG1}$ and $V_{DG2}$) are not the same. Thus, the gate leakage currents $I_{GL1}$ and $I_{GL2}$ of transistors $Q_1$ and $Q_2$ will be different since the gate leakage current $I_{GL1}$,$I_{GL2}$ depends exponentially on the drain-gate voltages $V_{DG1}$, $V_{DG2}$ applied.

Figure 5:
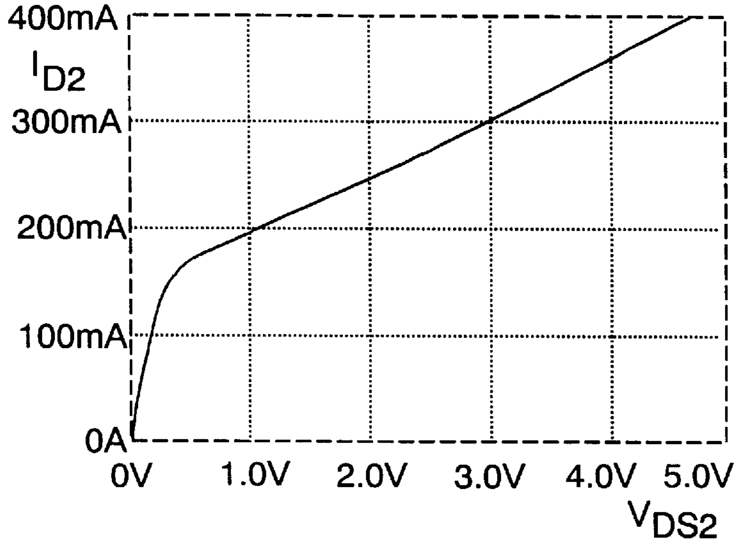
FIG. 5 is a graph illustrating the relationship between drain current and drain-source voltage in a biased transistor of a current mirror circuit due to gate leakage current.

FIG. 5 illustrates the drain current $I_{D2}$ ($I_{OUT}$) in the biased device $Q_2$ as a function of its drain-source voltage $V_{DS2}$ due to the effects of gate leakage current. The circuit utilized to generate the graph of FIG. 5 follows the schematic shown in FIG. 3, with transistors $Q_1$ and $Q_2$ being PHEMT transistors having a channel length of 0.5 $\mu$m. The value of resistor $R_2$ is 850 Ω, the geometrical channel width ratio $(W_2/W_1)$ is 75, and the desired output current $I_{D2}$ ($I_{OUT}$) is 150 mA. The deviation of the measured current $I_{D2}$ ($I_{OUT}$) from the desired value is due to the gate leakage current $I_{GL2}$ of $Q_2$ causing a voltage drop across $R_2$ that is different from the voltage drop across the ratioed resistor $R_1$, which is caused by the gate leakage current $I_{GL1}$ of $Q_1$.

Figure 6:
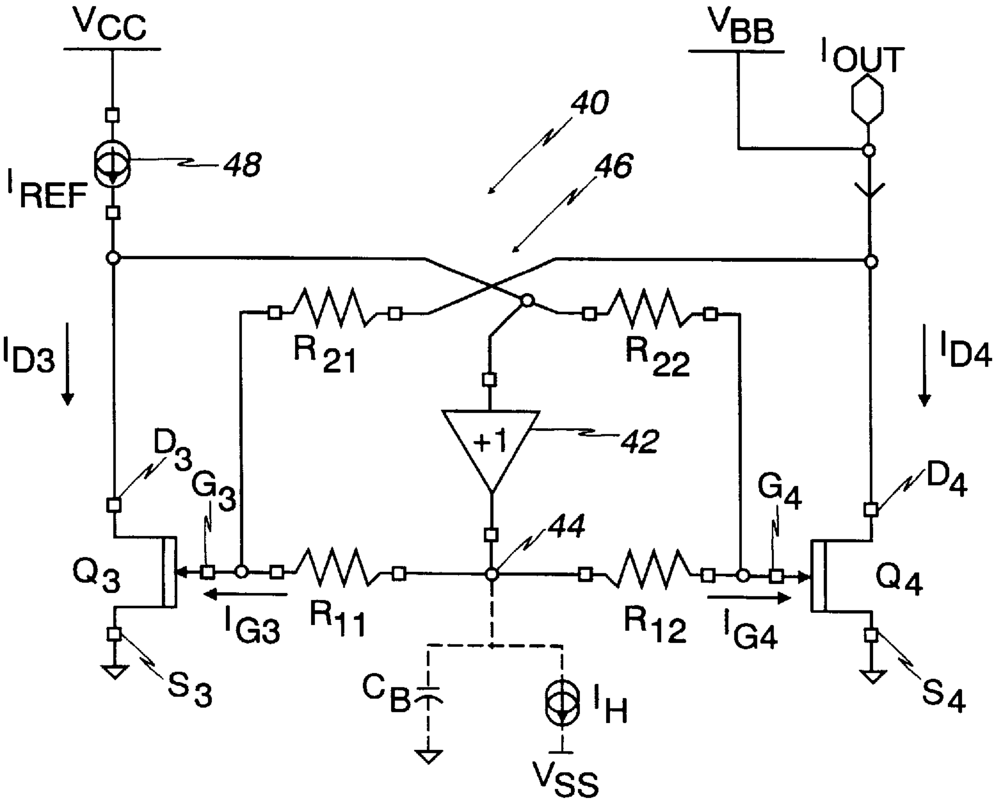
FIG. 6 shows a biasing circuit for a current mirror according to a first embodiment of the present invention compensating for short channel and threshold voltage modulation effects.

FIG. 6 illustrates a current biasing circuit, shown generally at 40, according to the present invention for minimizing the effects of short channel lengths and threshold voltage modulation generally present in current mirror circuits. The current biasing circuit 40 includes a reference transistor $Q_3$ and a biased transistor $Q_4$, each having drain D, source S and gate G contacts. Resistors $R_{11}$ and $R_{12}$ are serially connected between the gates $G_3$ and $G_4$ of transistors $Q_3$ and $Q_4$, with a unity gain amplifier 42, or feedback loop, connected between a node 44 common to resistors $R_{11}$ and $R_{12}$ and the drain $D_3$ of $Q_3$. Depending upon the implementation of the unity gain amplifier 42 as either the level shifter 22 (with current source $I_H$ and voltage source $V_{SS}$ ) of FIG. 2, or the feedback loop 14 of FIG. 1, the biasing circuit 40 shown in FIG. 6 can be implemented as a current mirror in MOSFET and/or MESFET technologies. The addition of capacitor $C_B$ makes it possible for the current biasing circuit 40 to be utilized in common source amplifiers (the signal SOURCE would be input to the gate $G_4$ of transistor $Q_4$).

The current biasing circuit 40 includes a compensation network 46 connected between transistors $Q_3$ and $Q_4$. The compensation network 46 includes a resistor $R_{21}$ connected between the gate $G_3$ of transistor $Q_3$ and the drain $D_4$ of transistor $Q_4$, and a resistor $R_{22}$ connected between the drain $D_3$ of the transistor $Q_3$ and the gate $G_4$ of transistor $Q_4$.

The sources $S_3$,$S_4$ of transistors $Q_3$,$Q_4$ are connected to ground. The gate currents $IG_3$, $IG_4$ are zero (or negligible with respect to $I_{REF}$), and accordingly, there is no voltage drop across resistors $R_{11}$ and $R_{12}$. Similarly, the currents through resistors $R_{21}$ and $R_{22}$ are negligible with respect to $I_{REF}$. Since the drain $D_3$ and gate $G_3$ of transistor $Q_3$ are connected together, via unity gain amplifier 42, the bias or output current $I_{OUT}$ ($I_{D4}$) mirrors a reference current $I_{REF}$ which flows into the drain $D_3$ of $Q_3$ and is supplied by a current source 48. However, as previously noted, various operational parameters, such as short channel effects, threshold voltage modulation and gate leakage currents, influence the current multiplication factor and thus the output current $I^{OUT}$ ($I_{D4}$). These operational parameters may result from a changing drain-source voltage $V_{DS4}$ in transistor $Q_4$, resulting from variations in the battery voltage $V_{BB}$ connected to the drain $D_4$ of transistor $Q_4$. The current biasing circuit 40 of FIG. 6 is designed to minimize the effects of these operational parameters.

For simplicity, it is assumed that there is only a threshold voltage ($V_t$) modulation effect influencing the transfer function of Eq. 1 ($\lambda$=0):

$$I_D=(K/2)\ (W/L)\ [V_{GS}-V_t]^n, \quad \text{(Eq. 3)}$$

where $$V_t=V_{to}-\alpha V_{DS}. \quad \text{(Eq. 4)}$$

The effective threshold voltage $V_3$ of transistor $Q_3$ is $V_{to}-\alpha V_{DS3}$, and the effective threshold voltage $V_{t4}$ of transistor $Q_4$ is $V_{to}-\alpha V_{DS4}$. As the drain-source voltages $V_{DS3}$, $V_{DS4}$ of transistors $Q_3$,$Q_4$ change, so does their respective threshold voltage $V_{t3}$,$V_{t4}$. As the threshold voltages $V_{t3}$,$V_{t4}$ of transistors $Q_3$,$Q_4$ change, so does their respective drain currents $I_{D3}$,$I_{D4}$. From Eqs. 3–4, it follows that the difference between the two effective threshold voltages $Vt_3$ and $V_{t4}$ is $$(V_{t3}-V_{t4})=\alpha(V_{DS4}-V_{DS3}). \quad \text{(Eq. 5)}$$

Since K, W and L in Eq. 3 are constants, the only way to compensate for a changing threshold voltage $V_t$ (due to threshold voltage modulation effects, i.e., changing $V_{DS}$) is to modify $V_{GS}$ such that $V_{GS}-V_t$, where $V_t=V_{to}-\alpha V_{DS}$ (Eq. 4), remains constant regardless of changes in the drain-source voltages. This is accomplished by the compensation network 46 of FIG. 6 as follows.

The output of the unity gain amplifier 42 forces a voltage $V_{CC}$ on its output at node 44. Basic circuit analysis reveals that the voltage on the gate $G_3$ of $Q_3$ ($V_{GS3}$) is higher than $V_{CC}$ by the amount $(V_{DS4}-V_{CC})$ $[R_{11}/(R_{11}+R_{21})]$, and similarly, the voltage on the gate $G_4$ of $Q_4$ ($V_{GS4}$) is higher than $V_{CC}$ by the amount $(V_{DS3}-V_{CC})$ $[R_{12}/(R_{12}+R_{22})]$.

For symmetry reasons in a unity current gain mirror, $R_{11}=R_{11}=R_1$, and similarly $R_{21}=R_{22}=R_2$. Accordingly, after simple algebraic manipulation, the difference of the two gates voltages $V_{GS3}$,$V_{GS4}$ is $$(V_{GS3}-V_{GS4})=[R_1/(R_1+R_2)](V_{DS4}-V_{DS3}). \quad \text{(Eq. 6)}$$

Comparing Eq. 5 and Eq. 6, the difference of the gate-source voltages $(V_{GS3}-V_{GS4})$ of transistors $Q_3$ and $Q_4$ can be made equal to the difference of their effective threshold voltages $(V_{t3}-V_{t4})$ if the following design choice is made: $\alpha=R_1/(R_1+R_2)$.

This is the appropriate design choice for cancellation of the threshold voltage modulation effects, and thus the influence of changing drain-source voltages $V_{DS3}$,$V_{DS4}$, on the output current $I_{OUT}$ ($I_{D4}$).

In the presence of short channel effects, the parameter $\lambda$ in the transfer function of Eq. 1 has a non-zero value and must be taken into account. The effect of $\lambda$ is similar to the effect of $\alpha$, in that $\lambda$ models the dependence of the drain current $I_D$ in transistors operating in the saturation region on their drain-source voltage $V_{DS}$. This dependence stems from channel length modulation, $L\rightarrow(L-\Delta L)$, with $\Delta L$ increasing with increasing $V_{DS}$. This leads to an additional factor in the drain current $I_D$ equation: $I_D\rightarrow I_D\times(1+\lambda V_{DS})$.

Adding this additional factor to the transfer function of Eq. 1, the drain currents $I_{D3}$,$I_{D4}$ for the transistors $Q_3$ and $Q_4$ in FIG. 6 are:

$$I_{D3}=(K/2)\ (W/L)\ [V_{GS3}-(V_{to}-\alpha V_{DS3})]^n(1+\lambda V_{DS3}), \quad \text{(Eq. 7)}$$

$$I_{D4}=(K/2)\ (W/L)\ [V_{GS4}-(V_{to}-\alpha V_{DS4})]_n(1+\lambda V_{DS4}). \quad \text{(Eq. 8)}$$

For compensation effects, it is assumed that the current through resistors $R_{11}$ and $R_{12}$ ($R_1$) and $R_{12}$ and $R_{22}$ ($R_2$) is negligible with respect to $I_{REF}$. Thus, $I_{D3}$ is approximately equal to $I_{REF}$.

Assuming a 1:1 current mirror, if the drain current $I_{D4}$ ($I_{OUT}$) through transistor $Q_4$ is to remain constant regardless of changes in $V_{DS3}$ and/or $V_{DS4}$, then it follows that:

$$\frac{\partial I_{D4}}{\partial V_{DS4}}=\frac{\partial I_{D4}}{\partial V_{DS3}}=0. \quad \text{(Eq. 9)}$$

Basic circuit analysis of the current biasing circuit 40 of FIG. 6 reveals that $$V_{GS3}=[R_2/(R_1+R_2)]V_{CC}+[R_1/(R_1+R_2)]V_{DS4}, \text{ and} \quad \text{(Eq. 10)}$$

$$V_{GS4}=[R_2/(R_1+R_2)]V_{CC}+[R_1/(R_1+R_2)]V_{DS3}. \quad \text{(Eq. 11)}$$

After algebraic elimination of $V_{CC}$, $$V_{GS4}=V_{GS3}+[R_1/(R_1+R_2)](V_{DS3}-V_{DS4}). \quad \text{(Eq. 12)}$$

By virtue of the unity gain amplifier 42, and the fact that $I_{D3}=I_{REF}$, $$V_{GS3}=(V_{to}-\alpha V_{DS3})[I_{REF}/((1+\lambda V_{DS3})(KW/2L))]^{1/n} \quad \text{(Eq. 13)}$$

Eq. 12 and Eq. 13 yield expressions that can be used to evaluate the partial derivatives of $I_{D4}$ (Eq. 8) with respect to $V_{DS3}$ and $V_{DS4}$ (Eq. 9). After calculation of the partial derivatives, a modified value for the appropriate values of the resistors is obtained, namely, $$R_1/(R_1+R_2)=\alpha+(\lambda/n)\ (V_{GS3}-V_{t3}). \quad \text{(Eq. 14)}$$

Since $Vt_3$ will be provided by the manufacturer of the transistor device $Q_3$, and $V_{GS3}$ can be determined by knowledge of $I_{REF}$ ($I_{D3}$), resistors $R_1$ ($R_{11}$ and $R_{12}$) and $R_2$ ($R_{21}$ and $R_{22}$) can be chosen to obtain the appropriate ratio of Eq. 14. This is the appropriate design choice for cancellation of threshold voltage modulation and short channel effects on the output current $I_{OUT}$ ($I_{D4}$)

Figure 7:
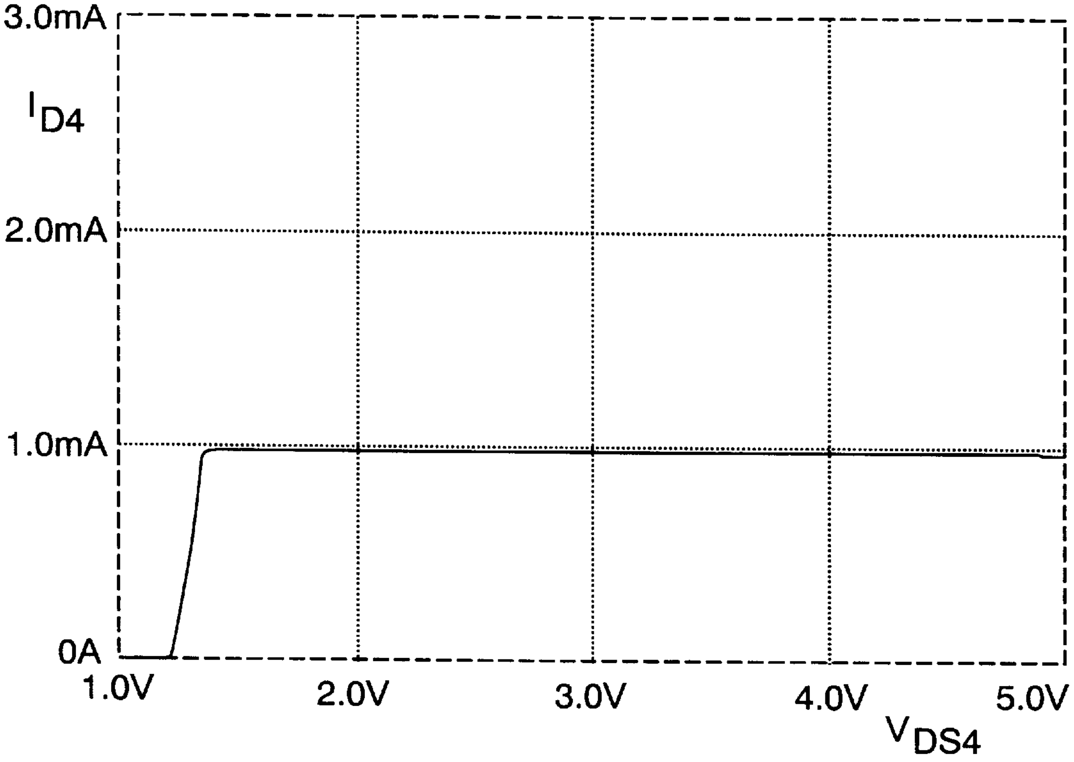
FIG. 7 is a graph illustrating the relationship between drain current and drain-source voltage in the biased transistor of the biasing circuit for a current mirror shown in FIG. 6.

FIG. 7 illustrates the drain current $I_{D4}$ ($I_{OUT}$) of $Q_4$ as a function of its drain-source voltage $V_{DS4}$ for the circuit of FIG. 6. Transistors $Q_3$ and $Q_4$ are PHEMT transistors each having a channel length of 0.5 $\mu$m. The geometric channel width ratio ($W_2/W_1$) is unity, with values for resistors $R_{11}$, $R_{12}$, $R_{21}$ and $R_{22}$ chosen as follows: $R_{11}$=1 kΩ; $R_{12}$=1 kΩ; $R_{21}$=50 kΩ; and $R_{22}$=50 kΩ. As seen from FIG. 7, the drain current $I_{D4}$ ($I_{OUT}$) through $Q_4$ remains constant regardless of changes in its drain-source voltage $V_{DS4}$. Since a unity gain amplifier was assumed, the drain current $I_{D4}$ ($I_{OUT}$) equals the reference current $I_{REF}$, which is approximately 1 mA.

Figure 8:
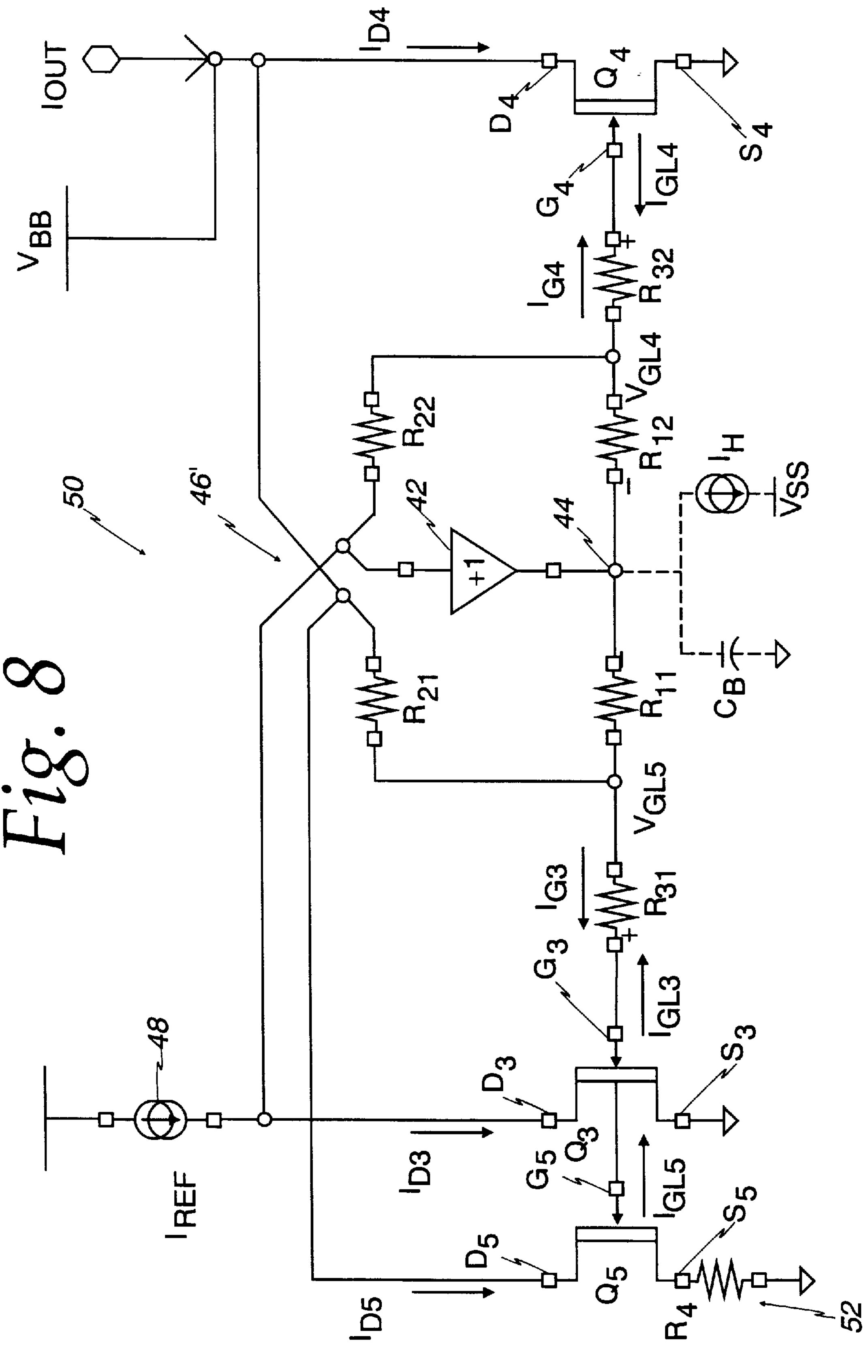
FIG. 8 shows a biasing circuit for a current mirror according to a second embodiment of the present invention additionally compensating for drain-gate reverse leakage current effects.

FIG. 8 illustrates a biasing circuit according to a second embodiment of the present invention, shown generally at 50, with like elements of FIG. 6 indicated with the same reference numbers and elements that have been modified indicated with a prime ('). In this second embodiment, the compensation network 46' further includes an additional compensation network 52 including transistor $Q_5$ and resistor $R_4$. Devices $Q_5$ and $R_4$ are added to minimize the effects of drain-gate reverse leakage currents as previously described. The drain $D_5$ of transistor $Q_5$ is connected to the drain $D_4$ of transistor $Q_4$, with the gate $G_5$ of transistor $Q_5$ connected to the gate $G_3$ of transistor $Q_3$. The resistor $R_4$ is connected between the source $S_5$ of transistor $Q_5$ and ground. The biasing circuit 50 is of particularly utility for large current multiplication ratios. The reason being that the absolute magnitudes of the drain-gate reverse leakage currents $I_{GL3}$ and $I_{GL4}$ of transistors $Q_3$ and $Q_4$ differ more for larger multiplication ratios. While this difference could be offset by ratioing the resistor values $R_{11}/R_{12}$ and $R_{12}/R_{22}$ according to the current mirror ratio, for large ratios this leads to unreasonably high resistance values for $R_{11}$ and $R_{12}$. In addition, this approach does not work for a wide range of drain-source voltages $V_{DS}$ of the biased transistor $Q_4$, but is only valid if the drain-source voltages $V_{DS3}$ and $V_{DS4}$ of both transistors $Q_3$ and $Q_4$ are equal.

Since large resistors generally consume a large amount of chip space and are not economical for monolithic integration, the total amount of chip area consumed by transistor $Q_5$ and resistor $R_4$, can be reduced by the addition of resistors $R_{31}$ and $R_{32}$. Resistor $R_{31}$ is connected between resistors $R_{11}$–$R_{21}$ and the gate $G_3$ of transistor $Q_3$, while resistor $R_{32}$ is connected between resistors $R_{12}$–$R_{22}$ and the gate $G_4$ of transistor $Q_4$.

The addition of resistors $R_{31}$ and $R_{32}$ permits scaling of resistors $R_{12}$ and $R_{22}$ by a scaling factor $S_2<1$, e.g., $R_{12}=S_2R_{12}$ and $R_{22}$32 $S_2R_{22}$, with resistor $R_{32}$ chosen to be $R_{32}=R_{22}(1-S_2)$. The scaling factor $S_2$ should be made as small as possible in a practical design, but big enough to keep the current $I_{D5}$ flowing in the compensation network 52 ($Q_5$ and $R_4$) below 5% to 10% of the reference current $I_{REF}$. It should be noted that the compensation network 52 ($Q_5$ and $R_4$) can be equally applied to both sides of the current mirror.

Operation of the biasing circuit 50 of FIG. 8 in minimizing drain-gate current leakage is as follows. Assume a large desired current multiplication factor, e.g., 75 as in a typical power amplifier application. Since $Q_4$ will be sized much larger than $Q_3$ (75×in the present example), the leakage current $I_{GL3}$ of the reference transistor $Q_3$ can be neglected with respect to the leakage current $I_{GL4}$ in the biased transistor $Q_4$. As a practical matter, the gate leakage currents for each transistor are known a priori, as the manufacturer of the device provides this information on the transistor spec sheet.

The transistor $Q_5$ is chosen such that its channel length is the same as the other transistors $Q_3$ and $Q_4$ in the biasing circuit 50. As previously discussed, the gate-source voltage $V_{GS3}$ of transistor $Q_3$ is ideally the same as the gate-source voltage $V_{GS4}$ of transistor $Q_4$ ($I_{G3}=I_{G4}=0$). It follows then, that the drain-gate voltage $V_{DG5}$ of transistor $Q_5$ is equal to the drain-gate voltage $V_{DG4}$ of the biased transistor $Q_4$. This results in the same gate leakage current densities (gate leakage current per area) in both devices $Q_4$ and $Q_5$. From the area ratios of transistors $Q_4$ and $Q_5$, the actual gate leakage current $I_{GL5}$ flowing out of the gate $G_5$ of transistor $Q_5$ can be determined.

The leakage current $I_{GL5}$ flowing out of the gate $G_5$ of transistor $Q_5$ creates a voltage drop $V_{GL5}$ across the resistor series connection $R_{31}$ and $R_{11}$. Similarly, the leakage current $I_{GL4}$ flowing out of the gate $G_4$ of transistor $Q_4$ creates a voltage drop $V_{GL4}$ across the resistor series connection $R_{32}$ and $R_{12}$. Resistors $R_{31}$, $R_{11}$, $R_{32}$ and $R_{12}$ are chosen such that $V_{GL5}=V_{GL4}$.

Due to the action of the feedback loop (amplifier 42) around the reference device $Q_3$, the gate voltage $V_{GS3}$ of transistor $Q_3$ is held constant and the voltage at the output (node 44) of the unity gain amplifier 42 is lowered. This will then lower the gate voltage $V_{GS4}$ of transistor $Q_4$ and thereby reduce the drain current $I_{D4}$ ($I_{OUT}$) of transistor $Q_4$.

The drain current $I_{D5}$ through transistor $Q_5$ is limited to a small value by resistor $R_4$ which forces the gate-source voltage $V_{GS5}$ of transistor $Q_5$ to be close to the gate-source voltages $V_{GS3}$ and $V_{GS4}$ of transistors $Q_3$ and $Q_4$. In this manner, it is ensured that the reverse gate leakage current densities are equal for transistors $Q_4$ and $Q_5$. The amount of drain current $I_{D5}$ in transistor $Q_5$ does not influence the accuracy of the compensation network 52 ($Q_5$ and $R_4$), however, it should be kept small.

In an ideal case, the channel widths $W_3$,$W_5$ of the transistors $Q_3$ and $Q_5$ are integer multiples of each other with the channel width $W_5$ of $Q_5$ smaller than the channel width $W_4$ of $Q_4$ ($W_4=NW_5$, with N>>1). Although this is not a requirement for proper operation of the biasing circuit 50, the chip area consumption due to the addition of the gate leakage compensation network 52 ($Q_5$ and $R_4$) is kept at a minimum.

Resistors $R_{11}$ and $R_{21}$ can be scaled by a scaling factor $S_1$ using the requirement that the current through the series connection of $S_1R_{21}$–$S_1R_{11}$ should be the same as the current through the series connection of $S_2R_{22}$–$S_2R_{12}$. This balances the current sum at the output of the unit gain amplifier 42 at node 44.

The scaling factor $S_1$ is chosen to be $S_1=S_2(V_{DS4}/V_{DS3})$. This leads to values for the resistors as follows: $R_{11}=S_1R_{11}$ and $R_{21}=S_1R_{21}$. To balance the gate-source voltage shifts on both sides of the current mirror, and thus ensure a constant drain current $I_{D4}$ ($I_{OUT}$), the resistor $R_{31}$ should be scaled accordingly:

$$R_{31}=R_{31}[(W_4/W_3)/(N+1)-S_1]/(1-S_2).$$

Figure 9:
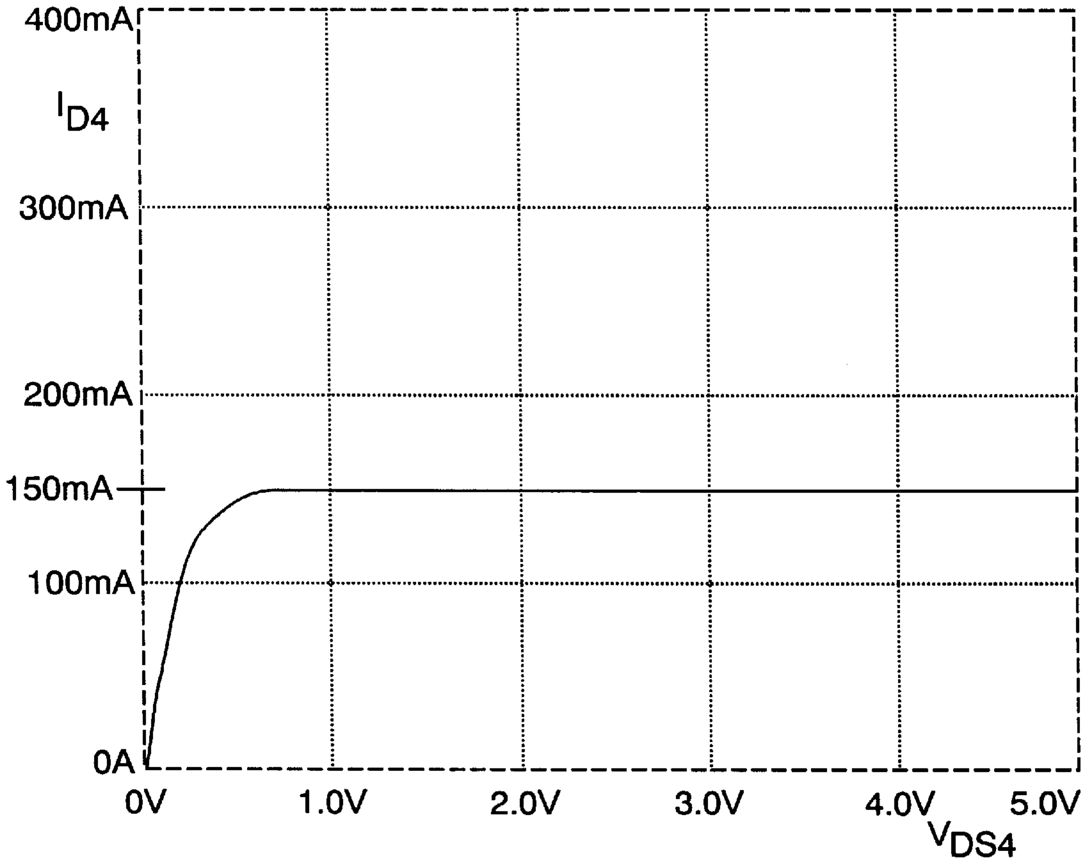
FIG. 9 is a graph illustrating the relationship between drain current and drain-source voltage in the biased transistor of the biasing circuit for a current mirror shown in FIG. 8.

FIG. 9 illustrates the drain current $I_{D4}$ ($I_{OUT}$) of transistor $Q_4$ as a function of its drain-source voltage $V_{DS4}$ achieved by the biasing circuit 50 of FIG. 8. Transistors $Q_3$, $Q_4$ and $Q_5$ are PHEMT transistors each having a channel length of 0.5 cm. The geometric channel width ratio ($W_4/W_3$) is 75. The reference current $I_{REF}$ is 2 mA. The resistor values are as follows: $R_{11}$=680 Ω; $R_{12}$=255 Ω; $R_{21}$=31 kΩ; $R_{22}$=11.6 kΩ; $R_{31}$=6.8 kΩ; $R_{32}$=595 Ω; and $R_4$=10 kΩ. As illustrated, the desired output current $I_{OUT}$ ($I_{D4}$) is 150 mA (equal to 75×the reference current $I_{REF}$) over a changing drain-source voltage $V_{DS4}$ in the biased device $Q_4$.

While the invention has been described with particular reference to the drawings, it should be understood that various modifications could be made without departing from the spirit and scope of the present invention.

What is claimed is:

1. A current mirror circuit comprising:

a reference device having control, input and output elements;

a reference current source connected to the input element ofthe reference device, said reference source producing a reference current flowing through the reference device;

a biased device having control, input and output elements, the control element of the biased device operably connected to the control element of the reference device, wherein a bias current is produced in the biased device as a multiple of the reference current; and a compensation network connected between the biased device and the reference device, the compensation network comprising a resistor network maintaining the bias current constant regardless of varying voltage across at least one ofthe biased device and the reference device.

2. The current mirror circuit of claim 1, wherein the reference and biased devices comprise field effect transistors having gate, drain and source elements corresponding to the control, input and output elements.

3. The current mirror circuit of claim 2, wherein the reference current flows from the drain to source elements in the reference transistor, the biased current flows from the drain to source elements in the biased transistor, and the varying voltage comprise a varying voltage across the drain and source elements of at least one of the biased transistor and the reference transistor.

4. The current mirror circuit of claim 3, wherein the varying voltage across the drain and source elements of at least one of the biased transistor and the reference transistor results from at least one of threshold voltage modulation, short channel effects and gate leakage current occurring in at least one of the biased transistor and the reference transistor.

5. A current mirror circuit comprising:

a reference device having control, input and output elements;

a reference current source connected to the input element of the reference device, said reference current source producing a reference current flowing through the reference device;

a biased device having control, input and output elements, the control element of the biased device operably connected to the control element of the reference device, wherein a bias current is produced in the biased device as a multiple of the reference current; and a compensation network connected between the biased device and the reference device, the compensation network maintaining the bias current constant regardless of varying operating characteristics in at least one of the biased device and the reference device, the compensation network comprising a first resistor connected between the input element of the reference device and the control element of the biased device, and a second resistor connected between the input element of the biased device and the control element of the reference device.

6. The current mirror circuit of claim 5, further comprising:

a third resistor connected between a first node and the control element of the reference device;

a fourth resistor connected between the first node and the control element of the biased device; and a feedback loop provided between the first node and the input element of the reference device.

7. The current mirror circuit of claim 6, wherein the feedback loop comprises a unity gain amplifier.

8. The current mirror circuit of claim 6, wherein the feedback loop comprises a level shifter biasing the reference device to operate in a saturation mode.

9. The current mirror circuit of claim 6, wherein the first and second resistors have equal resistance values, and wherein the third and fourth resistors have equal r esistance values.

10. The current mirror circuit of claim 6, wherein the compensation network further comprises:

a compensation device having control, input and output elements, the input element of the compensation device connected to the input element of the biased device, and the control element of the compensation device connected to the control element of the reference device; and a fifth resistor connected between the output element of the compensation device and ground.

11. The current mirror circuit of claim 10, wherein the compensation device comprises a field effect transistor having gate, drain and source elements corresponding to the control, input and output elements.

12. The current mirror circuit of claim 10, wherein the compensation network further comprises:

a sixth resistor connecting the second and third resistors to the control element of the reference device; and a seventh resistor connecting the first and fourth resistors to the control element of the biased device.

13. A current mirror circuit comprising:

a reference transistor having control, input and output elements;

a reference current source connected to the input element of the reference transistor, the reference current source producing a reference current flowing through the reference transistor;

a biased transistor having control, input and output elements, the control element of the biased transistor operably connected to the control element of the reference transistor, wherein a bias current is produced in the biased transistor as a multiple of the reference current;

first and second resistors serially connected between the control elements of the reference and biased transistors; and a compensation network connected between the biased transistor and the reference transistor for maintaining the bias current constant regardless of varying operating characteristics in at least one ofthe biased transistor and the reference transistor, said compensation network comprising:

a third resistor connected between the input element ofthe reference transistor and the control element of the biased transistor; and a fourth resistor connected between the input element of the biased transistor and the control element of the reference transistor.

14. The current mirror circuit of claim 13, further comprising a unity gain amplifier connected between the input element of the reference transistor and a node common to the first and second resistors.

15. The current mirror circuit of claim 13, wherein the reference and biased transistors comprise field effect transistors having gate, drain and source elements corresponding to the control, input and output elements, respectively.

16. The current mirror circuit of claim 15, wherein the reference and biased transistors comprise metal oxide semiconductor field effect transistors.

17. The current mirror circuit of claim 15, wherein the reference and biased transistors comprise metal semiconductor field effect transistors.

18. The current mirror circuit of claim 13, further comprising a bypass circuit connected between the node common to the first and second resistors and ground.

19. The current mirror circuit of claim 18, wherein the bypass circuit comprises a capacitor.

20. The current mirror circuit of claim 13, wherein the output elements of the reference and biased transistors are connected to ground.

21. The current mirror circuit of claim 13, wherein the first and second resistors have equal resistance values.

22. The current mirror circuit of claim 13, wherein the third and fourth resistors have equal resistance values.

23. The current mirror circuit of claim 13, wherein the compensation network further comprises a compensation circuit connected between the reference and biased transistors compensating for leakage current in the reference and biased transistors.

24. The current mirror circuit of claim 23, wherein the compensation circuit comprises a compensation transistor having control, input and output elements, the input element of the compensation transistor connected to the input element of the biased transistor, and the control element of the compensation transistor connected to the control element of the reference transistor.

25. The current mirror circuit of claim 24, wherein the compensation circuit further comprises a fifth resistor connected between the output element of the compensation transistor and ground.

26. The current mirror circuit of claim 24, wherein the compensation transistor comprises a field effect transistor having gate, drain and source elements corresponding to said control, input and output elements.

27. The current mirror circuit of claim 26, wherein the compensation transistor comprises a metal oxide semiconductor field effect transistor.

28. The current mirror circuit of claim 26, wherein the compensation transistor comprises a metal semiconductor field effect transistor.

29. The current mirror circuit of claim 23, wherein the compensation network further comprises:

a sixth resistor connecting the first and fourth resistors to the control element of the reference transistor; and a seventh resistor connecting the second and third resistors to the control element of the biased transistor.

* * * * *

UNITED STATES PATENT AND TRADEMARK OFFICE

CERTIFICATE OF CORRECTION

PATENT NO. : 6,255,897 B1
DATED : July 3, 2001
INVENTOR(S) : Klemmer

It is certified that error appears in the above-identified patent and that said Letters Patent is hereby corrected as shown below:

Column 10,
Line 57, should read as follows -- the bias current flows from the drain to source elements in the biased transistor, and --

Signed and Sealed this

Thirtieth Day of April, 2002

Attest:

JAMES E. ROGAN

*Attesting Officer* *Director of the United States Patent and Trademark Office*